(12) United States Patent
Chen

(10) Patent No.: US 7,233,503 B2
(45) Date of Patent: Jun. 19, 2007

(54) ASSEMBLED STRUCTURE AND CLAMPING DEVICE THEREOF

(75) Inventor: Wei-Chieh Chen, Guanyin Township, Taoyuan County (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 11/224,755

(22) Filed: Sep. 13, 2005

(65) Prior Publication Data

US 2006/0055031 A1    Mar. 16, 2006

(30) Foreign Application Priority Data

Sep. 15, 2004    (TW) .............................. 93127839 A

(51) Int. Cl.
*H05K 7/12* (2006.01)
(52) U.S. Cl. .................. 361/804; 361/742; 361/770; 361/758; 174/138 G
(58) Field of Classification Search ................ 361/742, 361/770, 758, 804, 753, 801; 174/138 G, 174/163 R
See application file for complete search history.

(56) References Cited

U.S. PATENT DOCUMENTS

| 4,495,380 | A  | * | 1/1985 | Ryan et al. ............. 174/138 D |
| 6,104,614 | A  | * | 8/2000 | Chou et al. ................. 361/704 |
| 6,399,887 | B1 | * | 6/2002 | Lin ........................ 174/138 D |
| 6,404,646 | B1 | * | 6/2002 | Tsai et al. .................... 361/758 |
| 6,781,055 | B2 | * | 8/2004 | Chen ........................... 174/535 |
| 7,034,222 | B1 | * | 4/2006 | York ............................ 174/50 |

* cited by examiner

*Primary Examiner*—Dean A. Reichard
*Assistant Examiner*—Dameon E. Levi
(74) *Attorney, Agent, or Firm*—Thomas, Kayden, Horstemeyer & Risley

(57) ABSTRACT

An assembled structure. A first substrate having a base surface is connected to a second substrate by at least one metallic clamping device. The clamping device, vertically disposed on the second substrate, comprises two parts: a first half and a second half having a supporting surface. The first half comprises a main unit and a plurality of spaced arm units disposed on the main unit, and each arm unit comprises a first part extending from the main unit and a second part extending from the first part. When the base surface of the first substrate contacts the supporting surface of the second half, at least one of the second parts of the arm units presses the first substrate on the second half, so that the first substrate is positioned by and electrically connected to the clamping device.

20 Claims, 6 Drawing Sheets

ASSEMBLED STRUCTURE AND CLAMPING DEVICE THEREOF

BACKGROUND

The invention relates to an assembled structure, and in particular to an assembled structure providing clamping devices to position a first substrate on a second substrate.

The main printed circuit board in a computer is generally fastened to the housing via screws, and grounded via one of the screws or an additional curved metallic clip. Fastening a main printed circuit board via screws, however, is time consuming; particularly when the main printed circuit board is large (more screws are required).

SUMMARY

The invention provides an assembled structure and a clamping device to position a first substrate on a second substrate to quickly position and ground the first substrate.

The assembled structure comprises a first substrate, a plurality of clamping devices and a second substrate. The first substrate having a base surface is connected to the second substrate by the metallic clamping devices. Each clamping device vertically disposed on the second substrate comprises two parts: a first half and a second half having a supporting surface. The first half comprises a main unit and a plurality of spaced arm units disposed on the main unit. Each arm unit comprises a first part extending from the main unit and a second part extending from the first part. When the base surface of the first substrate contacts the supporting surface of the second half, at least one of the second parts of the arm units presses the first substrate on the second half, so that the first substrate is positioned by and electrically connected to the clamping device.

DESCRIPTION OF THE DRAWINGS

The invention can be more fully understood by reading the subsequent detailed description and examples with references made to the accompanying drawings, wherein.

DETAILED DESCRIPTION

Figure 1B:
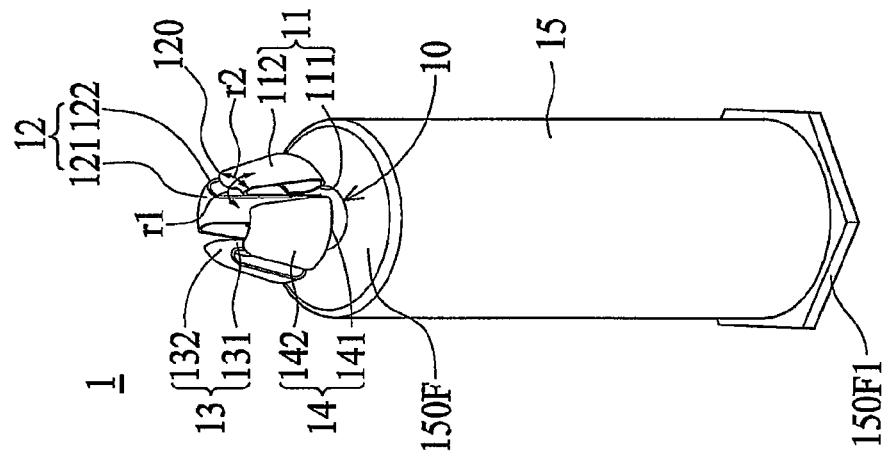
FIG. 1B is a perspective view of the clamping device of FIG. 1A.
Figure 1A:
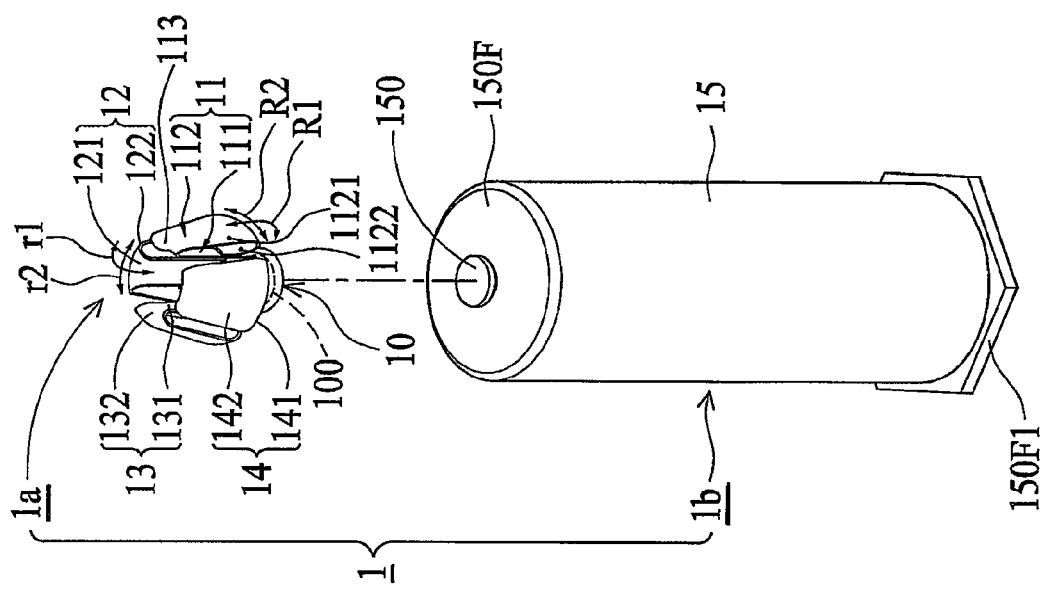
FIG. 1A is an exploded view of a clamping device of the invention.
Figure 2:
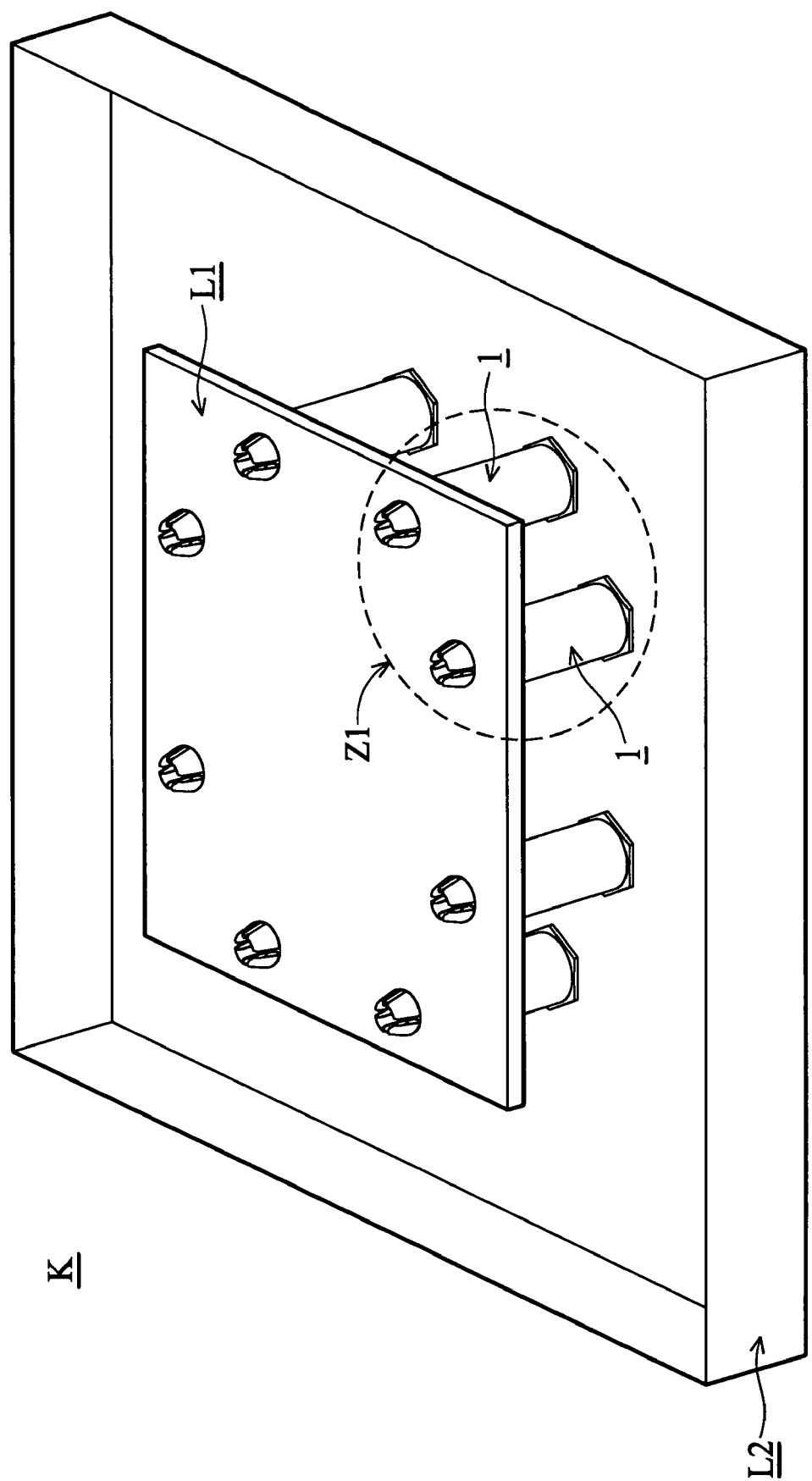
FIG. 2 is a perspective view of an assembled structure of the invention.
Figure 3A:
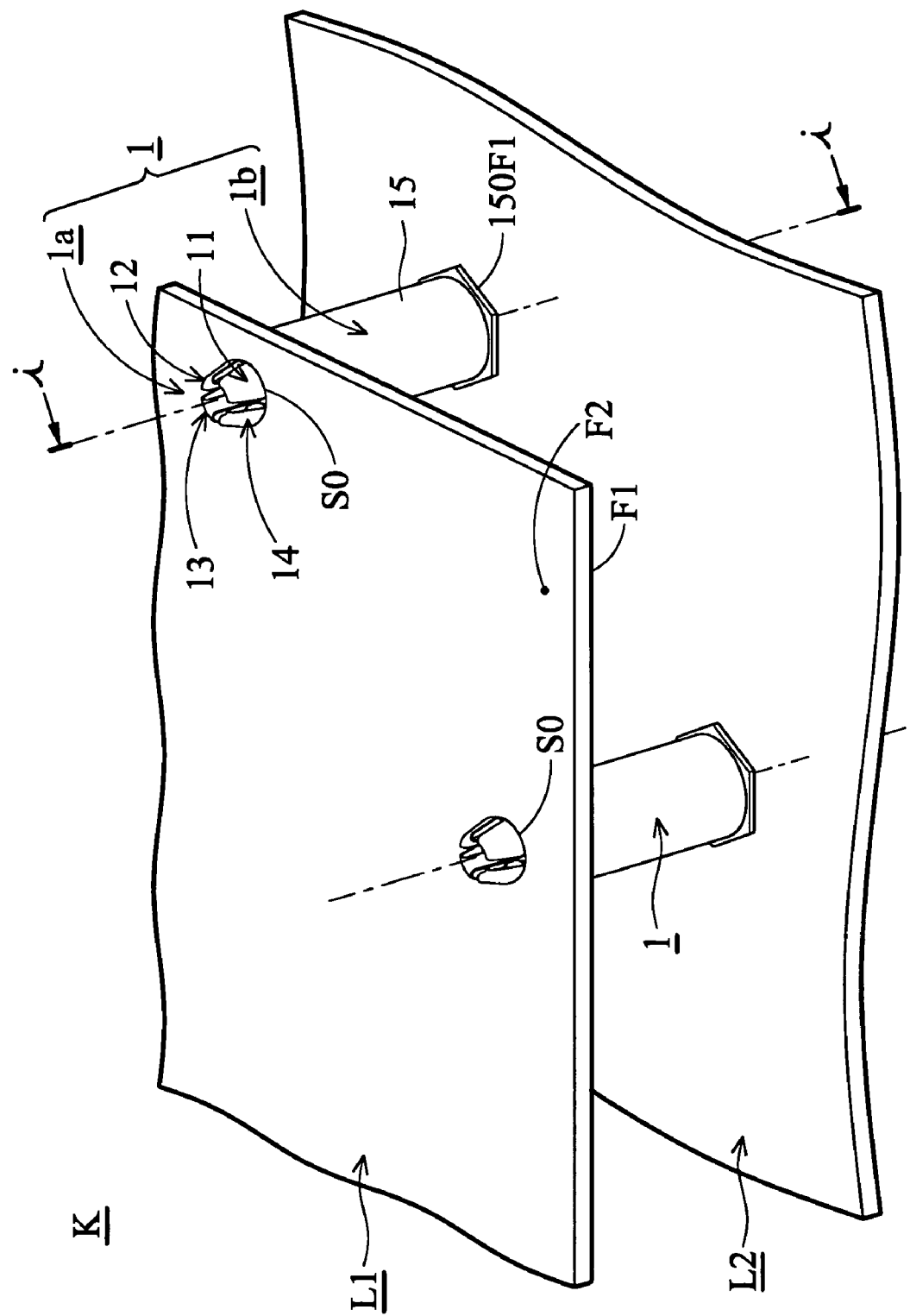
FIG. 3A is an enlarged perspective view of a dotted line (Z1) of FIG. 2.
Figure 3B:
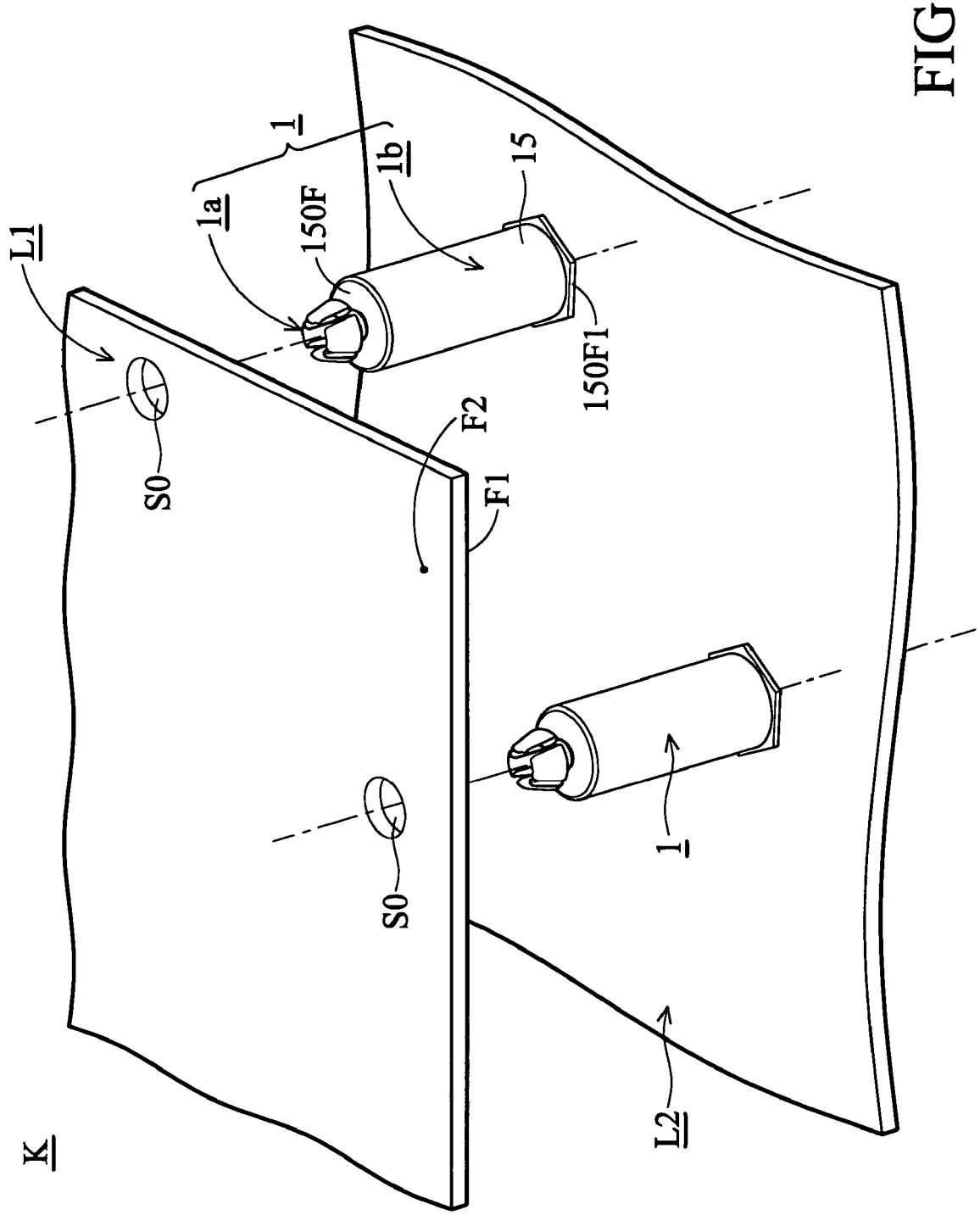
FIG. 3B is an exploded view of FIG. 3A.

FIGS. 1A and 1B are exploded and assembled views of a clamping device 1 of the invention, respectively, and FIG. 2 is a perspective view of an assembled structure K of the invention. FIG. 3A and is an enlarged perspective view of a dotted line Z1 of the assembled structure K in FIG. 2, and FIG. 3B is an exploded view of FIG. 3A.

Referring first to FIG. 3A, the assembled structure K comprises a first substrate L1, a plurality of clamping devices 1 and a second substrate L2. The first substrate L1 is disposed on the second substrate L2 via the clamping devices 1, i.e. the clamping devices 1 function as spacers therebetween. The first substrate L1 is a supported object such as a plate or a printed circuit board (PCB), and the second substrate L2 is another object such as a housing of a host for supporting the first substrate L1 thereon. In a preferred embodiment, the assembled structure K comprises at least one clamping device 1.

In FIGS. 1A and 1B, the clamping device 1 comprises a first part 1a and a second part 1b. The first part 1a comprises a main unit 10 and a plurality of arm units 11, 12, 13 and 14. The main unit 10 of the first part 1a comprises a first connecting portion 100. The second part 1b is a pillar member comprising a cylindrical body 15, a rounded supporting surface 150F, a hexagonal supporting surface 150F1 and a second connecting portion 150. The second connecting portion 150 is formed on the supporting surface 150F for connecting to the first connecting portion 100 of the main unit 10. In this embodiment, the first connecting portion 100 is a through hole and the second connecting portion 150 is a bump protruded from the supporting surface 150F, and the first connecting portion 100 is connected to the second connecting portion 150 by riveting.

The spaced arm units 11, 12, 13 and 14 radially extends from the main unit 10. In this embodiment, the clamping device 1 is a single element made of metallic plate or other conductive materials, i.e., the main unit 10 and the arm units 11, 12, 13 and 14 are integrally formed by a single metallic plate, and the arm unit 11, 12, 13 and 14 are reeds with same structure.

The arm unit 11 comprises a first part 111 extending from the main unit 10 and a second part 112 extending from the first part 111. The arm unit 12 comprises a first part 121 extending from the main unit 10 and a second part 122 extending from the first part 121. The arm unit 13 comprises a first part 131 extending from the main unit 10 and a second part 132 extending from the first part 131. The arm unit 14 comprises a first part 141 extending from the main unit 10 and a second part 142 extending from the first part 141.

The first part 111 of the arm unit 11, for example, is substantially a straight plate upwardly extending from the main unit 10, and the second part 112 is substantially a curved plate with C-shaped section extending outwardly from the first part 111. The second part 112, for example, substantially comprises a J-shaped structure comprising a first curvature R1, a second curvature R2 unequal to the first curvature R1, a first segment 1121 connected to the first part 111, and a second segment 1122 connected to the first segment 1121, wherein the first and second segments 1121 and 1122 are defined by the first and second curvatures R1 and R2. The arm unit 11 further comprises a middle part 113 disposed between the first part 111 and the second part 112, wherein the middle part 113 is defined by a first intersectional curvature r1 and a second intersectional curvature r2 unequal to the first intersectional curvature r1.

In FIG. 3B, the first substrate L1 comprises a base surface F1, a top surface F2 opposite to the base surface F1 and a plurality of positioning portions S0. The positioning portions S0 are rounded through holes penetrating the base surface F1 and the top surface F2. In a embodiment, the first substrate L1 comprises at least one positioning portion S0.

When the supporting surface 150F1 of the clamping device 1 is attached to the second substrate L2, the clamping device 1 is vertically disposed on the second substrate L2, and then the first substrate L1 is positioned above the second substrate L2 by fitting the positioning portions S0 thereof to the first part 1a of the clamping device 1.

Figure 4:
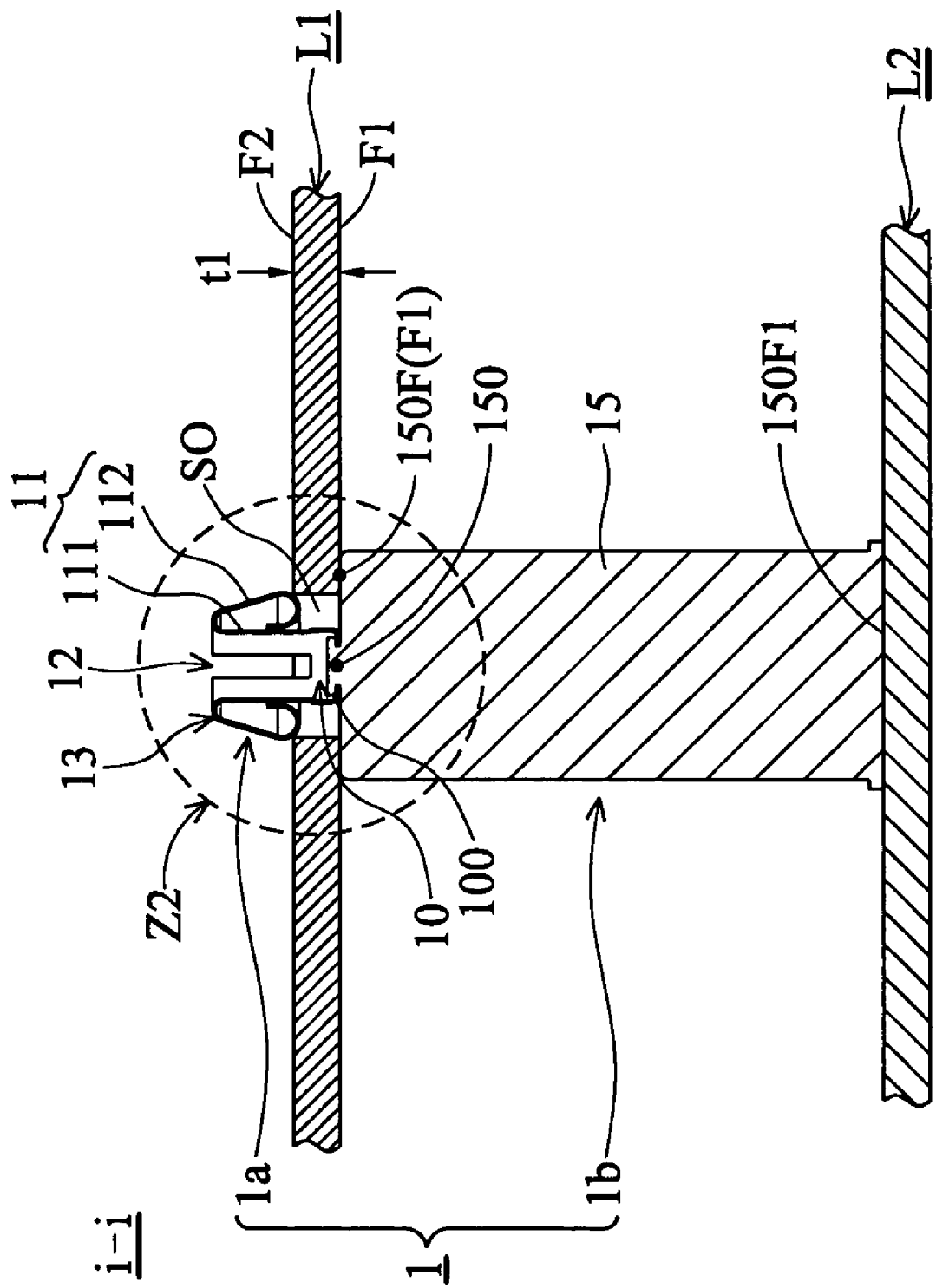
FIG. 4 is a section view of the assembled structure along a line (i-i) of FIG. 3A.

FIG. 4 is a section view of the assembled structure along a line i-i of FIG. 3A. When positioning the first substrate L1 on the second part 1b disposed on the second substrate L2, the first parts 1a of each clamping device 1 corresponding to the positioning portions S0 of the first substrate L1 are frictionally fitted into the positioning portions S0. First, the arm units 11, 12, 13 and 14 are pressed and inwardly contracted, and the movement of the first substrate L1 is then stopped when the base surface F1 of the first substrate L1 contacts the supporting surface 150F of the second part 1b. The first substrate L1, pressed by the second parts 112, 122, 132 and 142 of the arm units 11, 12, 13 and 14 of the first part 1a, is finally positioned onto the second parts 1b disposed on the second substrate L2.

Note that a conductive pattern or a circuit (not shown) can be placed onto the top surface F2 of the first substrate L1, so that the conductive pattern or a circuit on the first substrate L1 is electrically connected to the parts 112, 122, 132 and 142 of the arm units 11, 12, 13 and 14 of the metallic first part 1a or grounded thereby.

Figure 5:
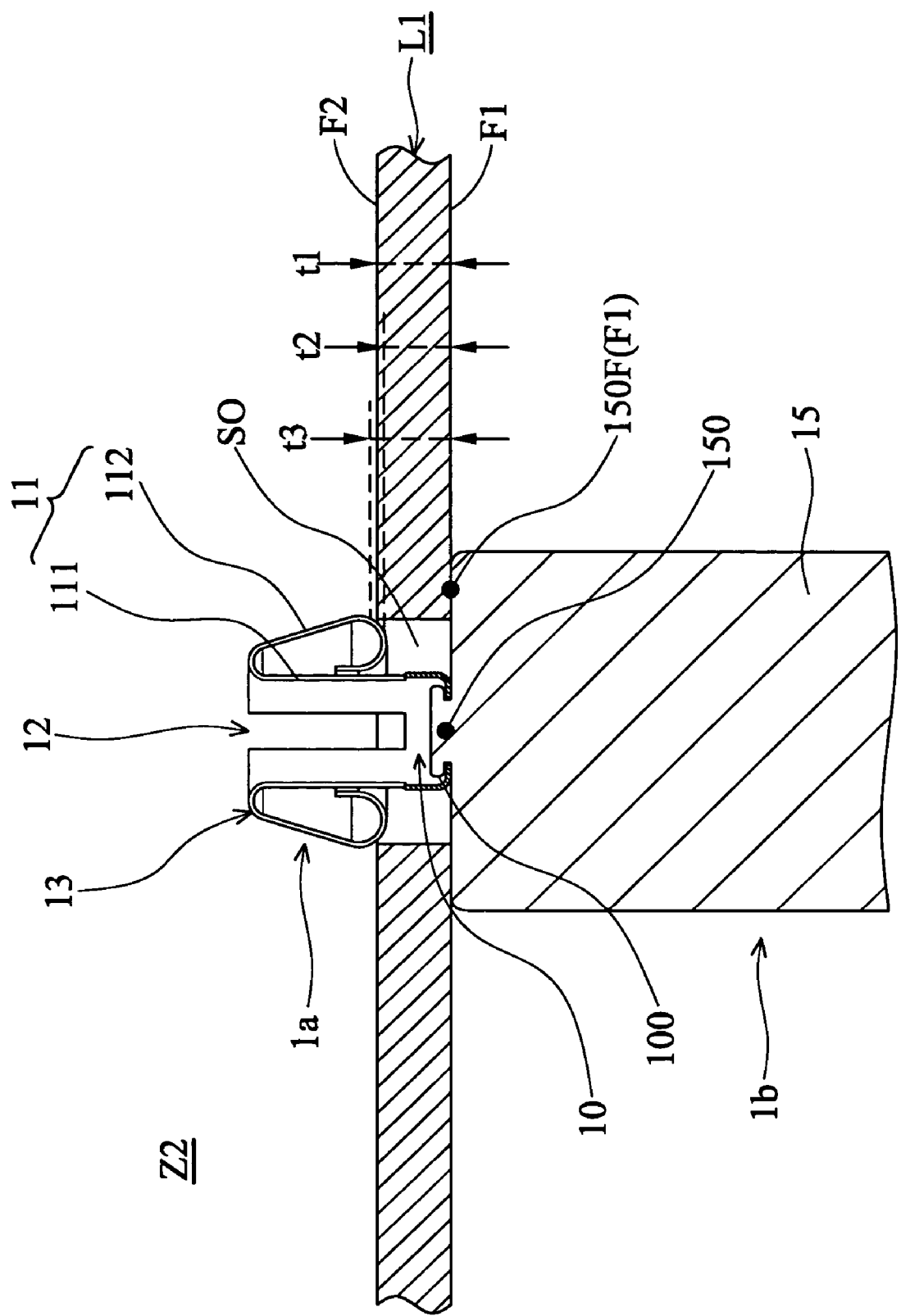
FIG. 5 is an enlarged perspective view of a dotted line (Z2) of FIG. 4.

FIG. 5 is an enlarged perspective view of a dotted line Z2 of FIG. 4. Once a plate or a PCB has a thickness t2 smaller than, or a thickness t3 larger than, the thickness t1 of the first substrate L1, the plate or PCB still can be securely positioned between the first substrate L1 and the second part 1b.

Thus, using bolts to secure the PCB, or an additional metallic plate to electrically connect to or ground the first substrate L1 in the related art can both be omitted.

While the invention has been described in connection with what is presently considered to be the most practical and preferred embodiment, it is to be understood that the invention is not limited to the disclosed embodiments, but, on the contrary, is intended to accommodate various modifications and equivalent arrangements included within the spirit and scope of the appended claims.

What is claimed is:

1. A clamping device, comprising:
   a main unit; and
   a plurality of arm units disposed on the main unit, each of which comprises a first part extending from the main unit and a second part extending from the first part, wherein the second part substantially comprises a J-shaped structure comprising a first curvature, a second curvature unequal to the first curvature, a first segment connected to the first part, and a second segment connected to the first segment, wherein the first and second segments are defined by the first and second curvatures.

2. The clamping device as claimed in claim 1, wherein the main unit and the arm units are integrally formed.

3. The clamping device as claimed in claim 1 further comprising a pillar member, wherein the main unit is disposed on the pillar member.

4. The clamping device as claimed in claim 1, wherein the main unit comprises a first connecting portion and the pillar member comprises a second connecting portion connected to the first connecting portion.

5. The clamping device as claimed in claim 1, wherein the second part comprises a substantially C-shaped structure.

6. The clamping device as claimed in claim 1, wherein the clamping device is made of metal.

7. An assembled structure, comprising:
   a first substrate comprising a base surface; and
   at least one clamping device comprises a first part and a second part, wherein the first part comprises a main unit and a plurality of arm units disposed on the main unit, and each arm unit comprises a first part extending from the main unit and a second part extending from the first part, and the second part comprises a supporting surface, wherein the second part substantially comprises a J-shaped structure comprising a first curvature, a second curvature unequal to the first curvature, a first segment connected to the first part, and a second segment connected to the first segment, wherein the first and second segments are defined by the first and second curvatures; when the base surface of the first substrate contacts the supporting surface of the second part, at least one of the second parts of the arm units of the first part presses the first substrate against the second part.

8. The assembled structure as claimed in claim 7, wherein the main unit and the arm units are integrally formed.

9. The assembled structure as claimed in claim 7, wherein the main unit comprises a first connecting portion and the pillar member comprises a second connecting portion connected to the first connecting portion.

10. The assembled structure as claimed in claim 7, wherein the second part comprises a substantially C-shaped structure.

11. The assembled structure as claimed in claim 7 further comprising a second substrate, wherein the clamping device is disposed on the second substrate.

12. The assembled structure as claimed in claim 7, wherein the first substrate comprises a circuit board.

13. The assembled structure as claimed in claim 7, wherein the clamping device is made of metal.

14. The assembled structure as claimed in claim 7, wherein the first substrate further comprises at least one positioning portion; when the positioning portion of the first substrate relatively contacts the second parts of the arm units of the first part as well as the first substrate contacts the supporting surface of the second part, the first substrate is positioned between the second part of the arm units of the first part and the second part.

15. The assembled structure as claimed in claim 14, wherein the positioning portion comprises a through hole penetrating the base surface.

16. The assembled structure as claimed in claim 7, wherein the first substrate is grounded via the clamping device.

17. The clamping device as claimed in claim 1, wherein each of the arm units further comprises a middle part disposed between the first part and the second part, wherein the middle part is defined by a first intersectional curvature and a second intersectional curvature unequal to the first intersectional curvature.

18. The assembled structure as claimed in claim 7, wherein each of the arm units further comprises a middle part disposed between the first part and the second part, wherein the middle part is defined by a first intersectional curvature and a second intersectional curvature unequal to the first intersectional curvature.

19. A clamping device, comprising:
   a main unit; and
   a plurality of arm units disposed on the main unit, each of which comprises a first part extending from the main unit and a second part extending from the first part, wherein the second part substantially comprises a J-shaped structure comprising a first segment connected to the first part and a second segment connected to the first segment, wherein the second segment comprises a distal end disposed between the first part and the first segment of the second part.

20. The clamping device as claimed in claim 19, wherein each of the arm units further comprises a middle part disposed between the first part and the second part, wherein the middle part is defined by a first intersectional curvature and a second intersectional curvature unequal to the first intersectional curvature.

* * * * *